(12) United States Patent
Collins et al.

(10) Patent No.: US 8,288,244 B2
(45) Date of Patent: Oct. 16, 2012

(54) LATERAL PASSIVE DEVICE HAVING DUAL ANNULAR ELECTRODES

(75) Inventors: David S. Collins, Williston, VT (US); Jeffrey B. Johnson, Essex Junction, VT (US); Xuefeng Liu, South Burlington, VT (US); Bradley A. Orner, Fairfax, VT (US); Robert M. Rassel, Colchester, VT (US); David C. Sheridan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 12/835,283

(22) Filed: Jul. 13, 2010

(65) Prior Publication Data
US 2010/0279483 A1 Nov. 4, 2010

Related U.S. Application Data

(62) Division of application No. 11/422,125, filed on Jun. 5, 2006, now Pat. No. 7,821,097.

(51) Int. Cl.
*H01L 21/76* (2006.01)
*H01L 29/00* (2006.01)

(52) U.S. Cl. ......... 438/427; 438/424; 438/404; 257/506

(58) Field of Classification Search .......... 438/207, 438/218, 219, 294, 296, 404, 427; 257/506, 257/517
See application file for complete search history.

(56) References Cited

U.S. PATENT DOCUMENTS

| | | | |
|---|---|---|---|
| 4,346,265 A | 8/1982 | Buss et al. | |
| 4,997,776 A | 3/1991 | Harame et al. | |
| 5,411,898 A | 5/1995 | Kinoshita et al. | |
| 5,466,348 A | 11/1995 | Holm-Kennedy | |
| 6,396,107 B1 | 5/2002 | Brennan et al. | |
| 6,399,449 B1 * | 6/2002 | Matsumoto | 438/296 |
| 6,429,500 B1 | 8/2002 | Greenberg et al. | |
| 6,737,929 B1 | 5/2004 | Cui et al. | |
| 6,770,952 B2 | 8/2004 | Babcock et al. | |
| 6,784,487 B2 | 8/2004 | Plikat | |
| 6,867,107 B2 | 3/2005 | Asai et al. | |
| 6,956,266 B1 | 10/2005 | Voldman et al. | |
| 6,967,363 B1 | 11/2005 | Buller | |
| 7,208,077 B1 | 4/2007 | Albers et al. | |
| 2003/0025175 A1 | 2/2003 | Asano et al. | |

(Continued)

FOREIGN PATENT DOCUMENTS

JP 63221668 A 9/1988

(Continued)

OTHER PUBLICATIONS

Collins et al., U.S. Appl. No. 11/422,125, filed Jun. 5, 2006, Office Communication dated Jun. 25, 2007, 13 pages.

(Continued)

*Primary Examiner* — Ori Nadav
(74) *Attorney, Agent, or Firm* — Anthony Canale; Hoffman Warnick LLC

(57) ABSTRACT

A method for forming a lateral passive device including a dual annular electrode is disclosed. The annular electrodes formed from the method include an anode and a cathode. The annular electrodes allow anode and cathode series resistances to be optimized to the lowest values at a fixed device area. In addition, the parasitic capacitance to a bottom plate (substrate) is greatly reduced.

4 Claims, 13 Drawing Sheets

U.S. PATENT DOCUMENTS

2003/0067026 A1  4/2003  Bulucea
2003/0162355 A1  8/2003  Sankin et al.
2006/0125040 A1  6/2006  Levin et al.

FOREIGN PATENT DOCUMENTS

WO  0062048 A2  10/2000

OTHER PUBLICATIONS

Collins et al., U.S. Appl. No. 11/422,125, filed Jun. 5, 2006, Office Communication dated Sep. 26, 2007, 14 pages.
Collins et al., U.S. Appl. No. 11/422,125, filed Jun. 5, 2006, Office Communication dated Feb. 25, 2008, 13 pages.
Collins et al., U.S. Appl. No. 11/422,125, filed Jun. 5, 2006, Office Communication dated May 29, 2008, 14 pages.
Collins et al., U.S. Appl. No. 11/422,125, filed Jun. 5, 2006, Office Communication dated Jan. 2, 2009, 8 pages.
Collins et al., U.S. Appl. No. 11/422,125, filed Jun. 5, 2006, Office Communication dated Apr. 20, 2009, 9 pages.
Collins et al., U.S. Appl. No. 11/422,125, filed Jun. 5, 2006, Office Communication dated Nov. 5, 2009, 10 pages.
Collins et al., U.S. Appl. No. 11/422,125, filed Jun. 5, 2006, Notice of Allowance and Fee(s) Due dated Jun. 18, 2010, 4 pages.

* cited by examiner

LATERAL PASSIVE DEVICE HAVING DUAL ANNULAR ELECTRODES

CROSS-REFERENCE TO RELATED APPLICATIONS

This application is a divisional of U.S. patent application Ser. No. 11/422,125, filed Jun. 5, 2006 now U.S. Pat. No. 7,821,097. The application identified above is incorporated herein by reference in its entirety for all that it contains in order to provide continuity of disclosure.

GOVERNMENT INTEREST

The U.S. Government has a paid-up license in this invention and the right in limited circumstances to require the patent owner to license others on reasonable terms as provided by the terms of government contract N66001-02-C-8014, awarded by the Defense Advanced Research Project Agency (DARPA).

BACKGROUND OF THE INVENTION

1. Technical Field

The invention relates generally to semiconductor device fabrication, and more particularly, to a lateral passive device having dual annular electrodes and a related method.

2. Background Art

To optimize passive devices for radio frequency (RF) applications, the series resistance and parasitic capacitance need to be reduced. Referring to FIG. 1, one approach to reduce the capacitance is to increase a distance ($L_d$) between an anode 10 and a cathode 12, and minimize device area. Under this approach, conventional lateral devices, such as a PIN diode, PN diode, Schottky barrier diode (SBD), etc. are designed using striped structures. For example, as shown in FIG. 1, one stripe 10 is used as an anode and another stripe 12 is used as the cathode. A distance ($L_d$) is provided between stripe 10 and stripe 12. Unfortunately, to reduce resistance for this kind of structure, the device size has to be increased, which results in a device with larger layout area and a larger associated parasitic capacitance. In other words, the requirements to reduce parasitic capacitance are diametrically opposed to the requirements to reduce series resistance.

SUMMARY OF THE INVENTION

A lateral passive device is disclosed including a dual annular electrode. The annular electrodes form an anode and a cathode. The annular electrodes allow anode and cathode series resistances to be optimized to the lowest values at a fixed device area. In addition, the parasitic capacitance to a bottom plate (substrate) is greatly reduced. In one embodiment, a device includes a first annular electrode surrounding a second annular electrode formed on a substrate, and the second annular electrode surrounds an insulator region. A related method is also disclosed.

A first aspect of the invention provides a device formed on a substrate, the device comprising: a first annular electrode surrounding a second annular electrode, and the second annular electrode surrounding a first insulator region.

A second aspect of the invention provides a lateral passive device comprising: an insulator region; an annular electrode surrounding the insulator region; a first annular insulator region surrounding the annular electrode; and another annular electrode surrounding the first annular insulator region.

A third aspect of the invention is directed to a method comprising: providing a substrate; forming a first insulator region in the substrate; forming an annular electrode surrounding the first insulator region; and forming another annular electrode surrounding the first annular insulator region.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
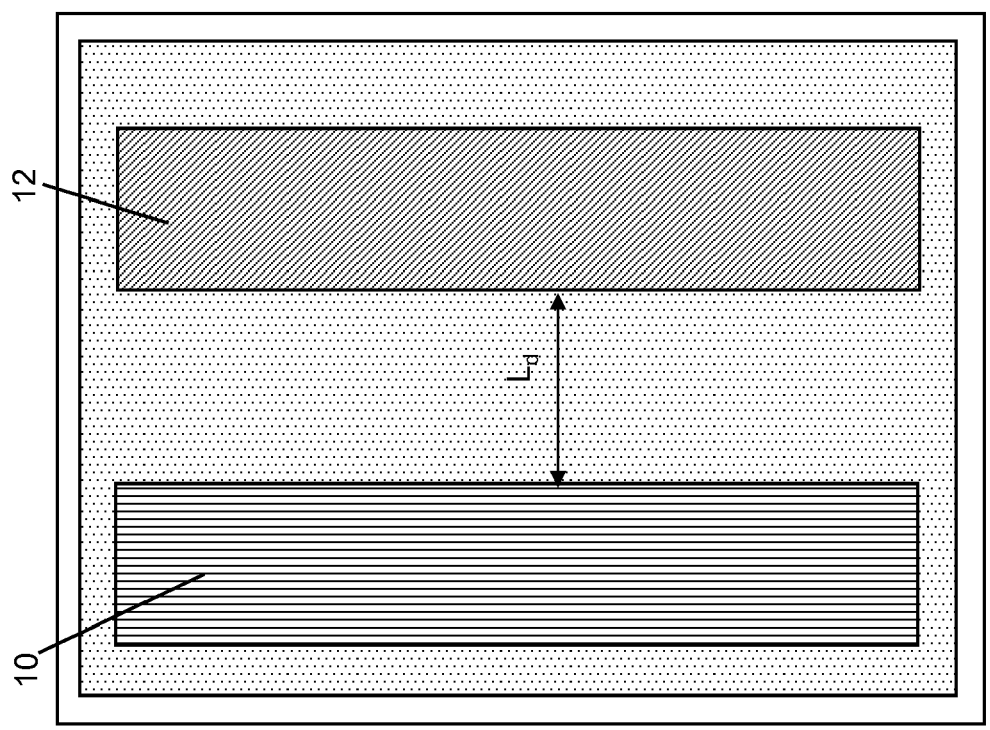
FIG. 1 show a prior art lateral passive device.
Figure 2:
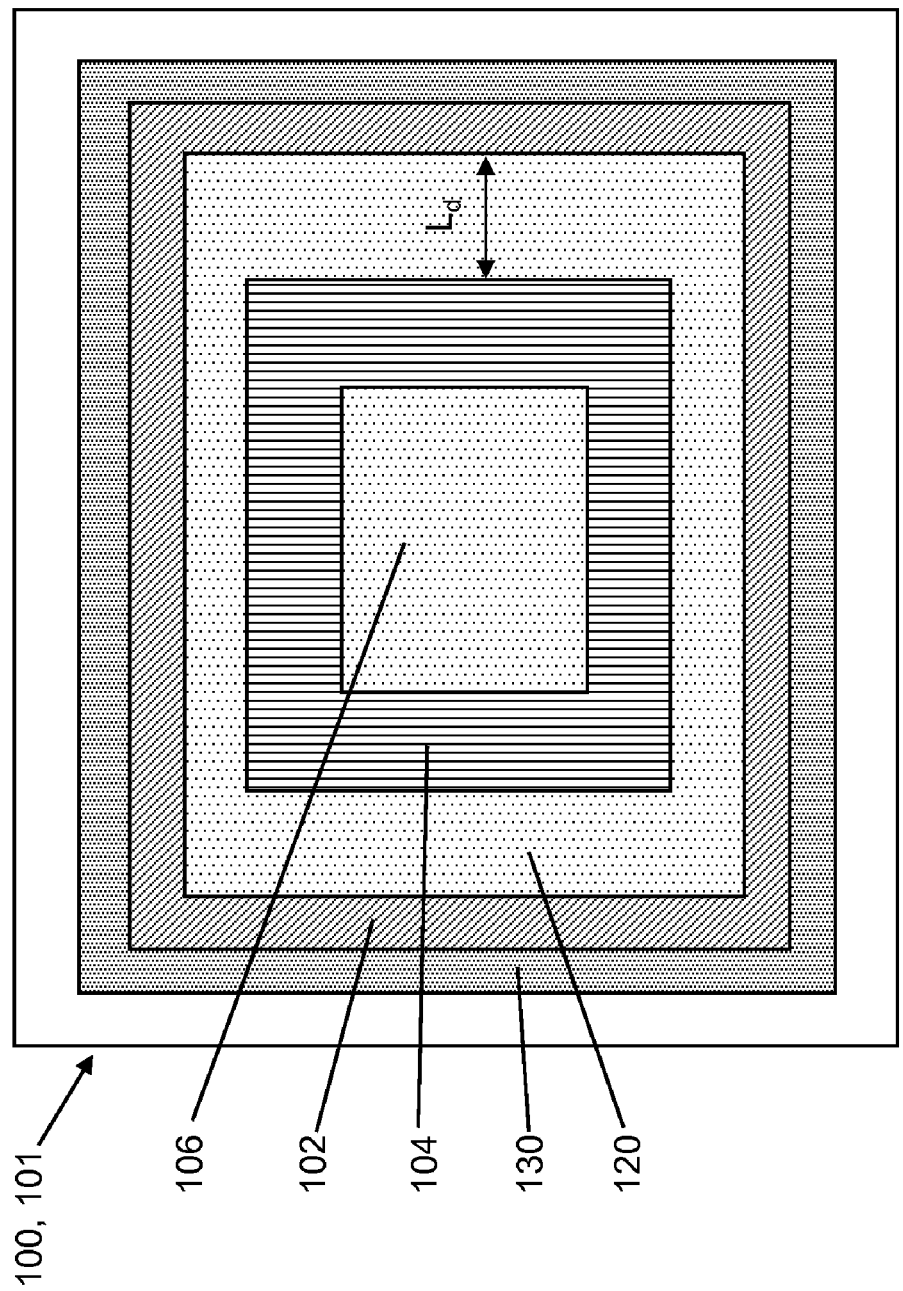
FIG. 2 shows a top view of one embodiment of a lateral passive device according to the invention.
Figure 3:
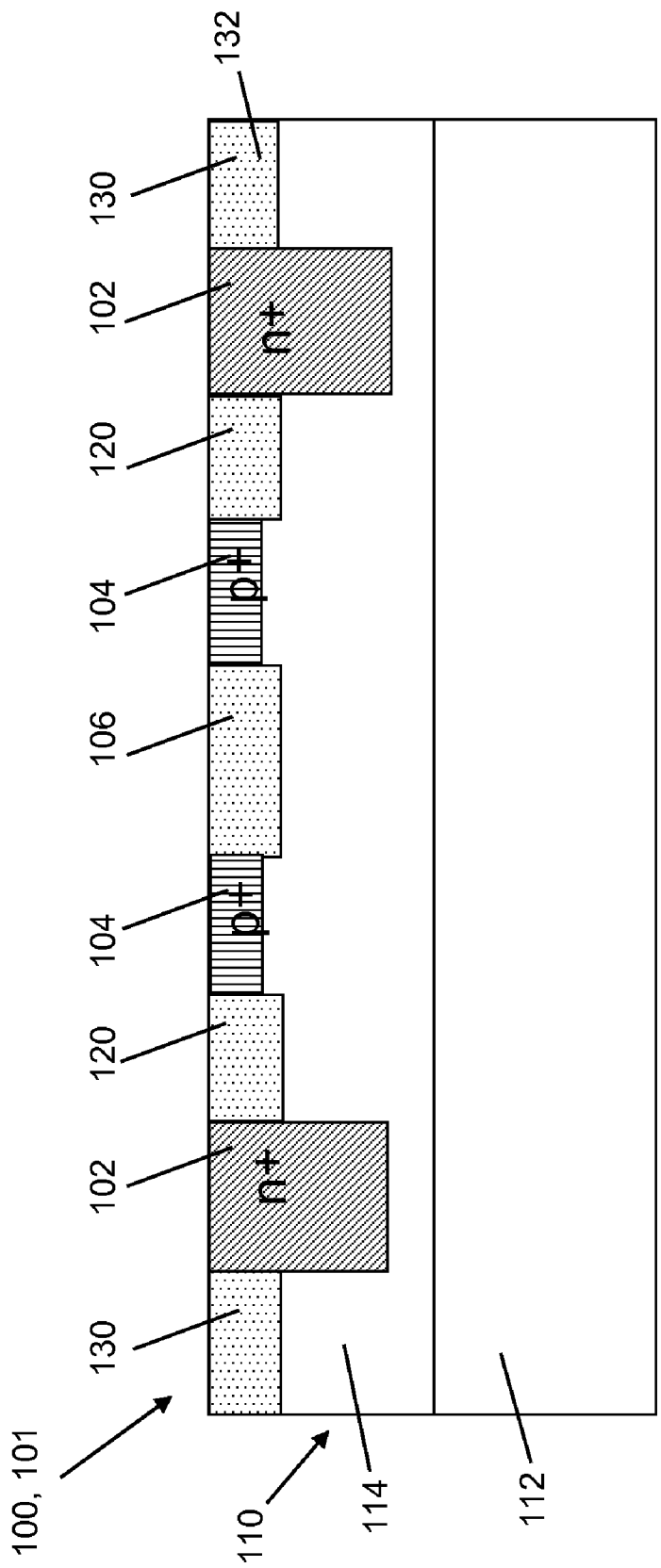
FIG. 3 shows a cross-sectional view of the lateral passive device of FIG. 2.

Referring to FIGS. 2-3, one embodiment of a device 100 according to the invention is shown. In one embodiment, device 100 takes the form of a lateral passive device 101 such as a lateral PN diode, a lateral PIN diode, a Schottky barrier diode or a varactor. Lateral passive device 101 includes a first annular electrode 102 surrounding a second annular electrode 104. Second annular electrode 104 surrounds a first insulator region 106, which is not annular (i.e., a non-annular, block). As used herein, the terms "first," "second," "third," etc., are used for differentiation purposes only and not to denote any chronological formation or relative positioning, or to express any other meaning Each annular electrode 102, 104 may be formed by doping a silicon substrate 110. In one embodiment, silicon substrate 110 may include a bulk silicon substrate 112 and an epitaxially grown N-silicon layer 114 thereon. It is understood, however, that the teachings of the invention may be applied to other silicon substrates such as silicon-on-insulator (SOI) substrates, pre-doped silicon (e.g., with germanium), or any other now known or later developed silicon substrate. For example, epitaxially grown silicon layer 114 may be omitted if bulk silicon substrate 112 has a resistivity greater than approximately 2 ohm-cm. Lateral passive device 101 may also include an annular insulator region 120 between first annular electrode 102 and second annular electrode 104 to electrically isolate electrodes 102, 104. Alternatively, electrodes 102, 104 may simply be separated by silicon. However, this is not preferred in a self aligned silicide (salicide) process and would additionally require a thin insulating film to block salicidation in order to electrically isolate electrodes 102 and 104. In one embodiment, annular insulation region 120 has a width ($L_d$) of no smaller than approximately 0.1 μm. In one embodiment, width ($L_d$) is substantially uniform.

As illustrated in FIG. 3, in one embodiment, annular insulator region 120 includes a shallow trench isolation (STI). As used herein, "shallow trench isolation (STI)" may include an insulation structure having a depth of approximately 100 nm to approximately 400 nm. Similarly, "trench isolation (TI)" as used herein may include an insulation structure having a depth of approximately 1 μm to approximately 3 μm, and "deep trench isolation (DT)" may include an insulation structure having a depth of approximately 5 μm to approximately 8 μm. It is understood, however, that the terms STI, TI and DT are used as relative differentiators and that the actual depths of the various types of trench isolations may vary from the dimensions stated above. The insulation material used may include any now known or later developed insulation structure material such as silicon oxide ($SiO_2$) (shown in FIG. 3), boro-phosphorous glass (BPSG) or polysilicon (Si) for, for example, an STI. Similarly, the insulation material may include any of the above or, as shown for example in FIG. 6, polysilicon (polySi) 192 with a silicon oxide ($SiO_2$) liner and silicon nitride ($Si_3N_4$) liner 198 for TI or DT (only shown for DT). As shown best in FIG. 9, where TI 134 or DT 136 is used, they may extend through or have an STI 132 upper extremity.

As shown in FIG. 3, in one embodiment, first annular electrode 102 is doped with an n+ dopant such as phosphorous (P), arsenic (As) or antimony (Sb). Similarly, second annular electrode 104 is doped with a p+ dopant such as boron (B), indium (In) or gallium (Ga). As such, first annular electrode 102 includes a cathode and second annular electrode 104 includes an anode. It is understood, however, that which electrode 102, 104 provides the anode or cathode can be switched depending on the type of dopant used.

Figure 4:
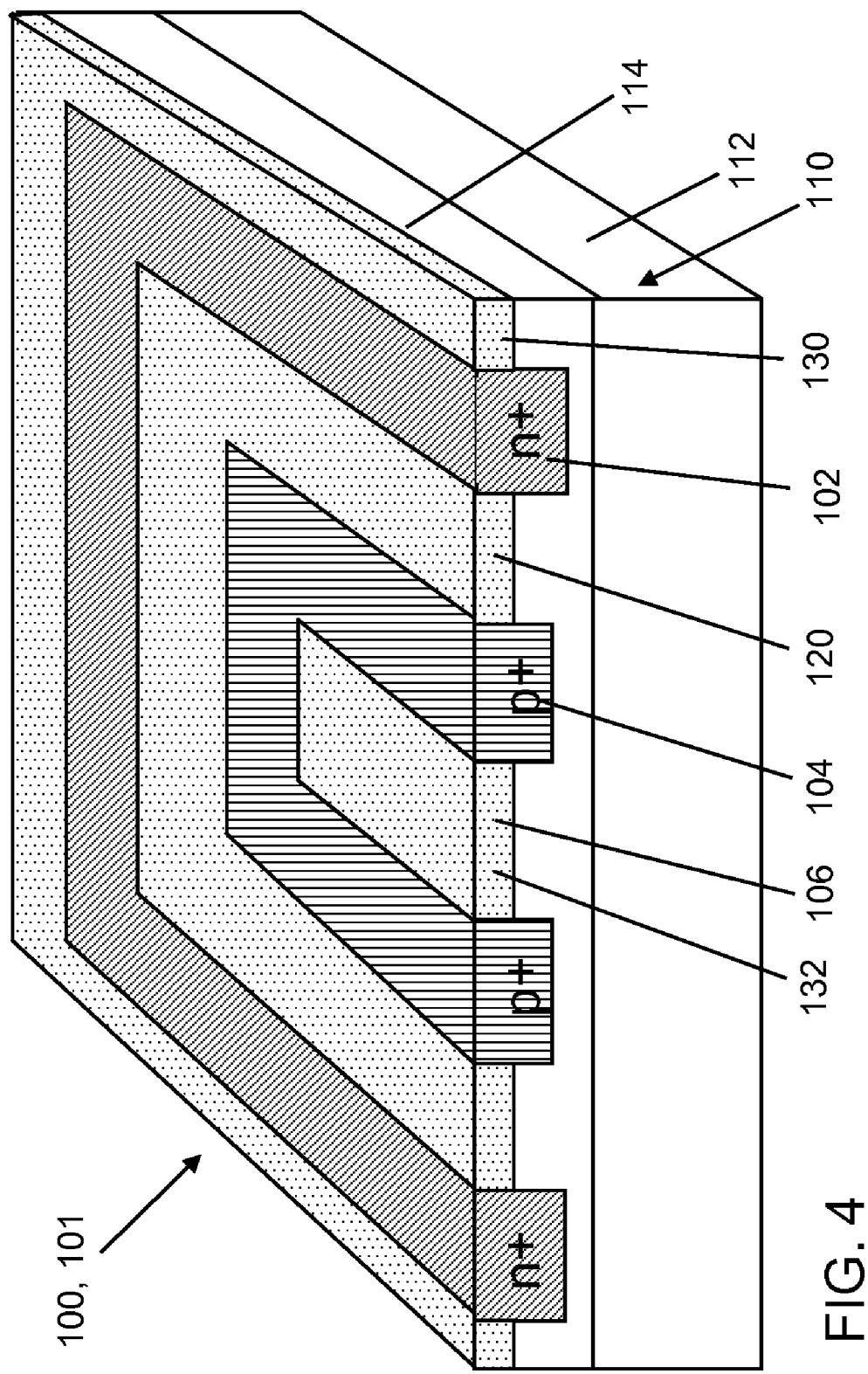
FIG. 4 shows a perspective view of the lateral passive device of FIG. 2.

As shown in FIGS. 2-4, for example, in one embodiment, lateral passive device 101 may also include another annular insulator region 130 surrounding first annular electrode 102 to electrically isolate the entire device 100 from other devices (not shown). As will be described further below, insulation region 106 and annular insulator region 130 may each include a STI 132 (FIG. 3), a TI 134 (e.g., FIG. 5) or a DT 136 (e.g., FIG. 6). When one utilizes only STI for annular insulator region 130, lateral passive device 101 may be positioned at a sufficient distance away from other devices (not shown) within silicon substrate 110 so as not to electrically interfere. The use of DT or TI as annular insulator region 130 enables better device-to-device isolation in order to reduce required spacing between devices.

Figure 5:
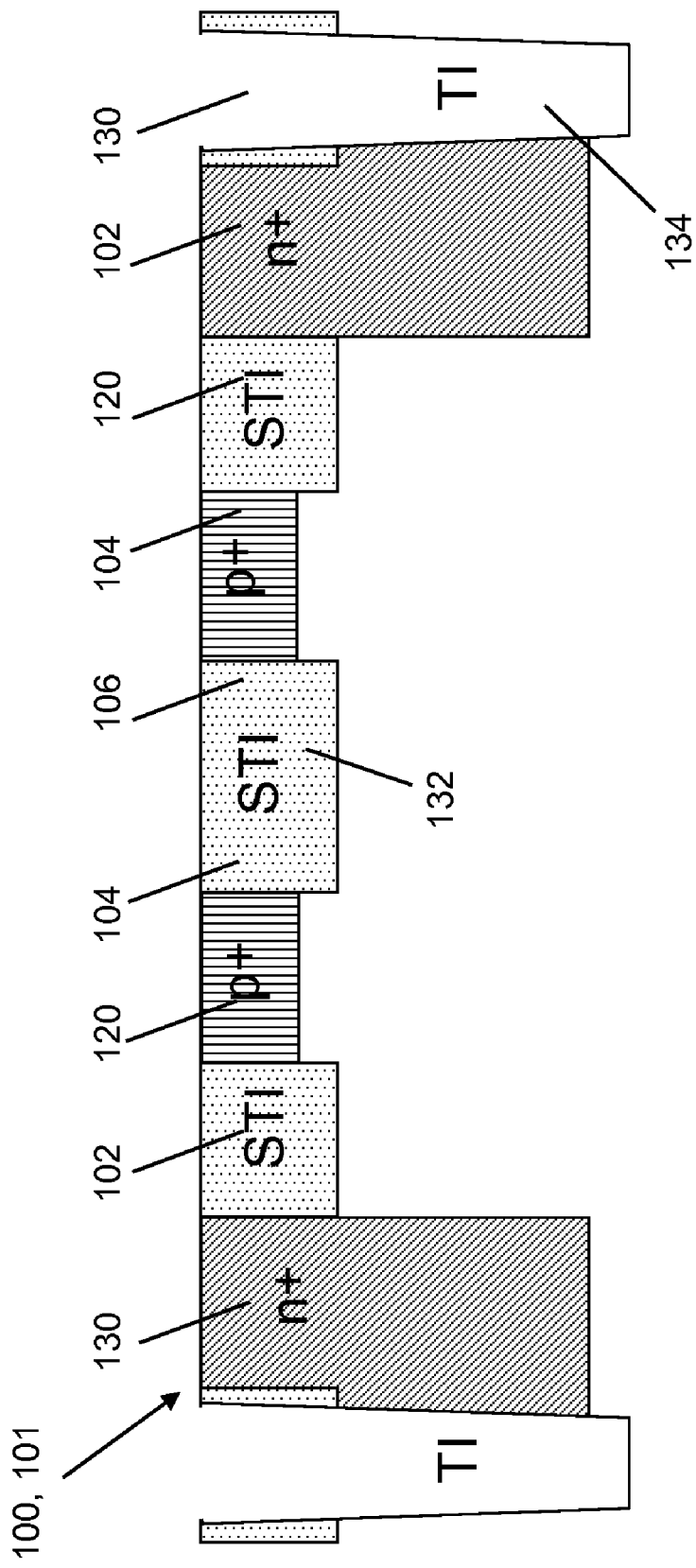
FIGS. 5-11 show various embodiments of a lateral passive device according to the invention.
Figure 6:
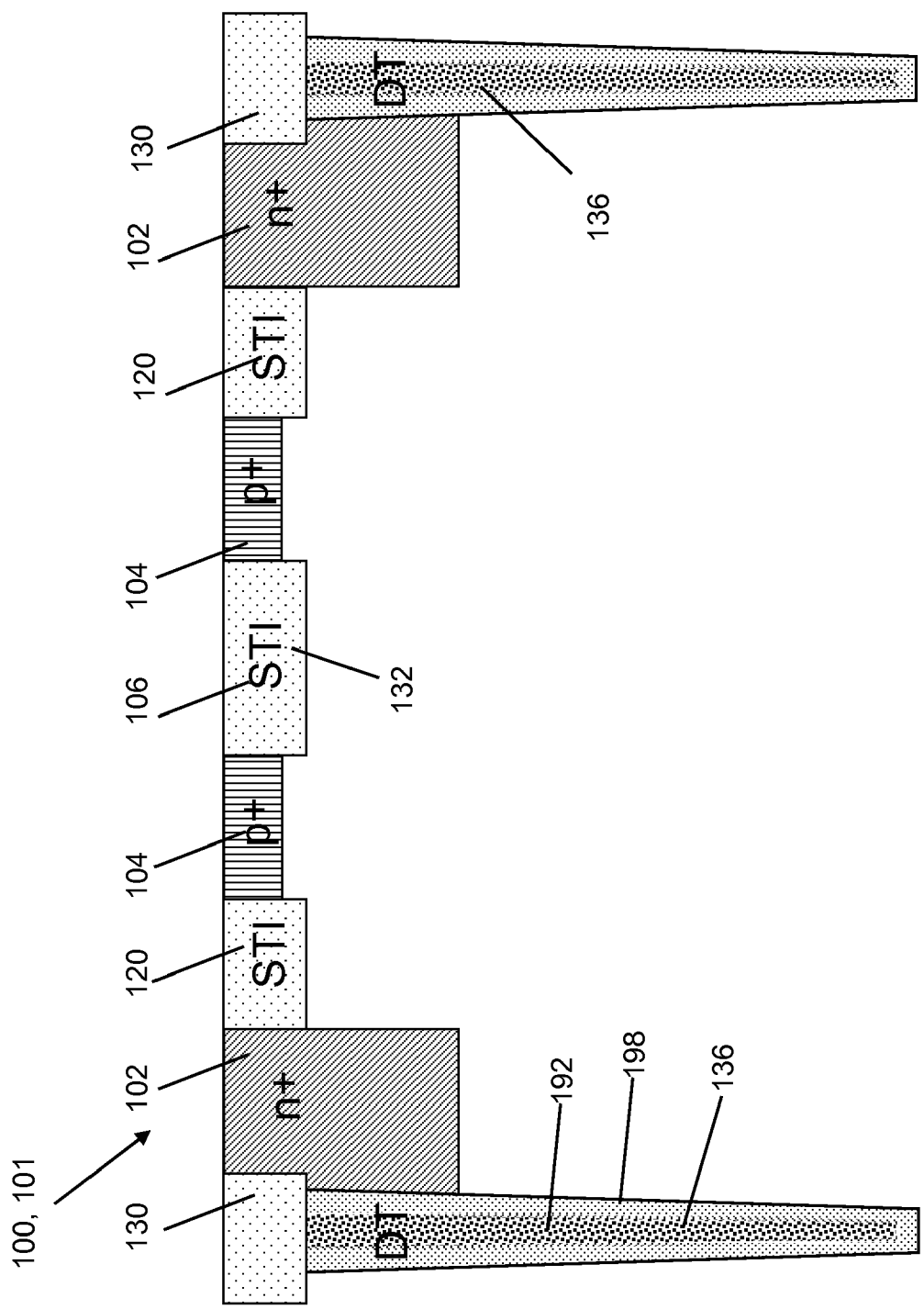
Figure 7:
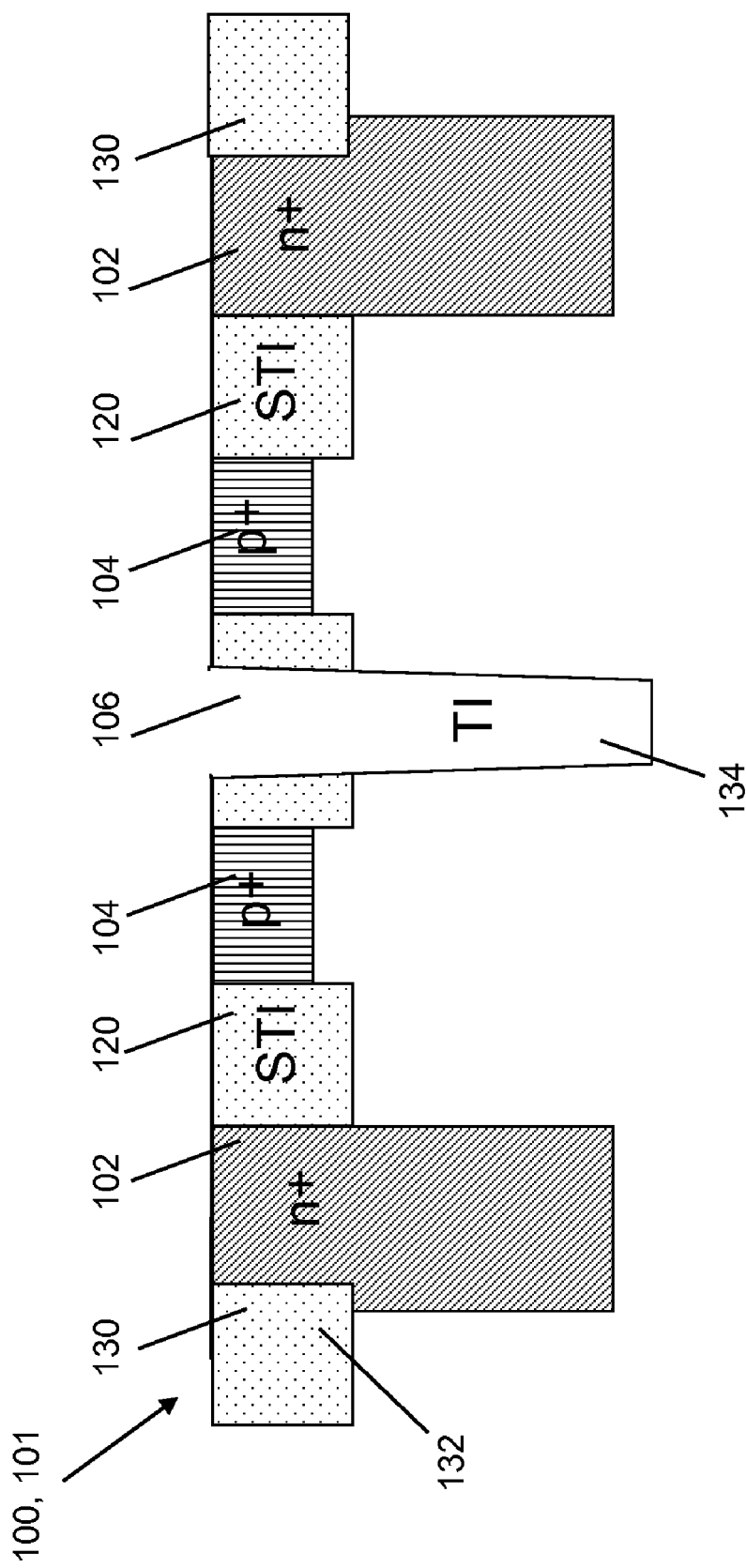
Figure 8:
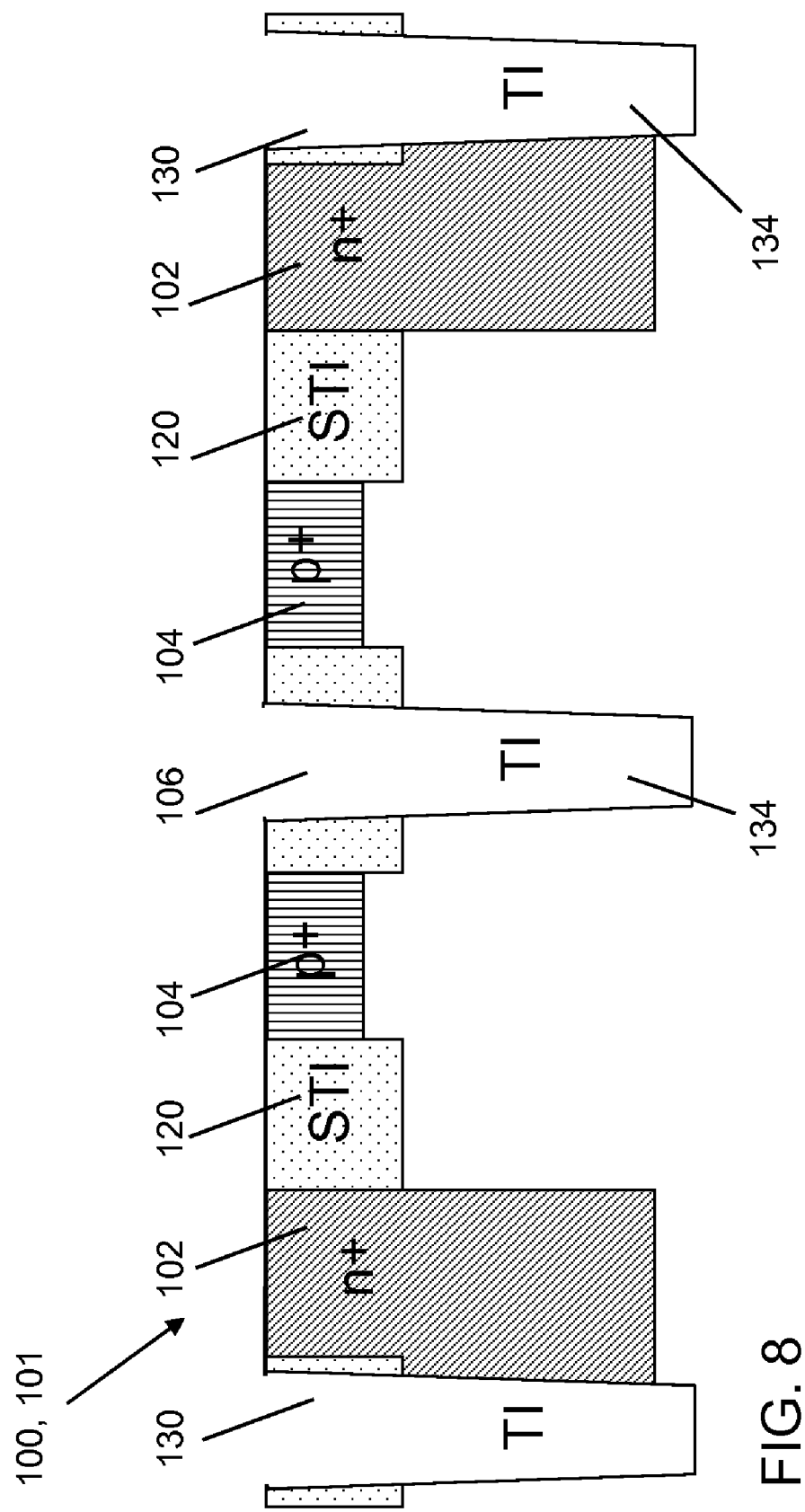
Figure 9:
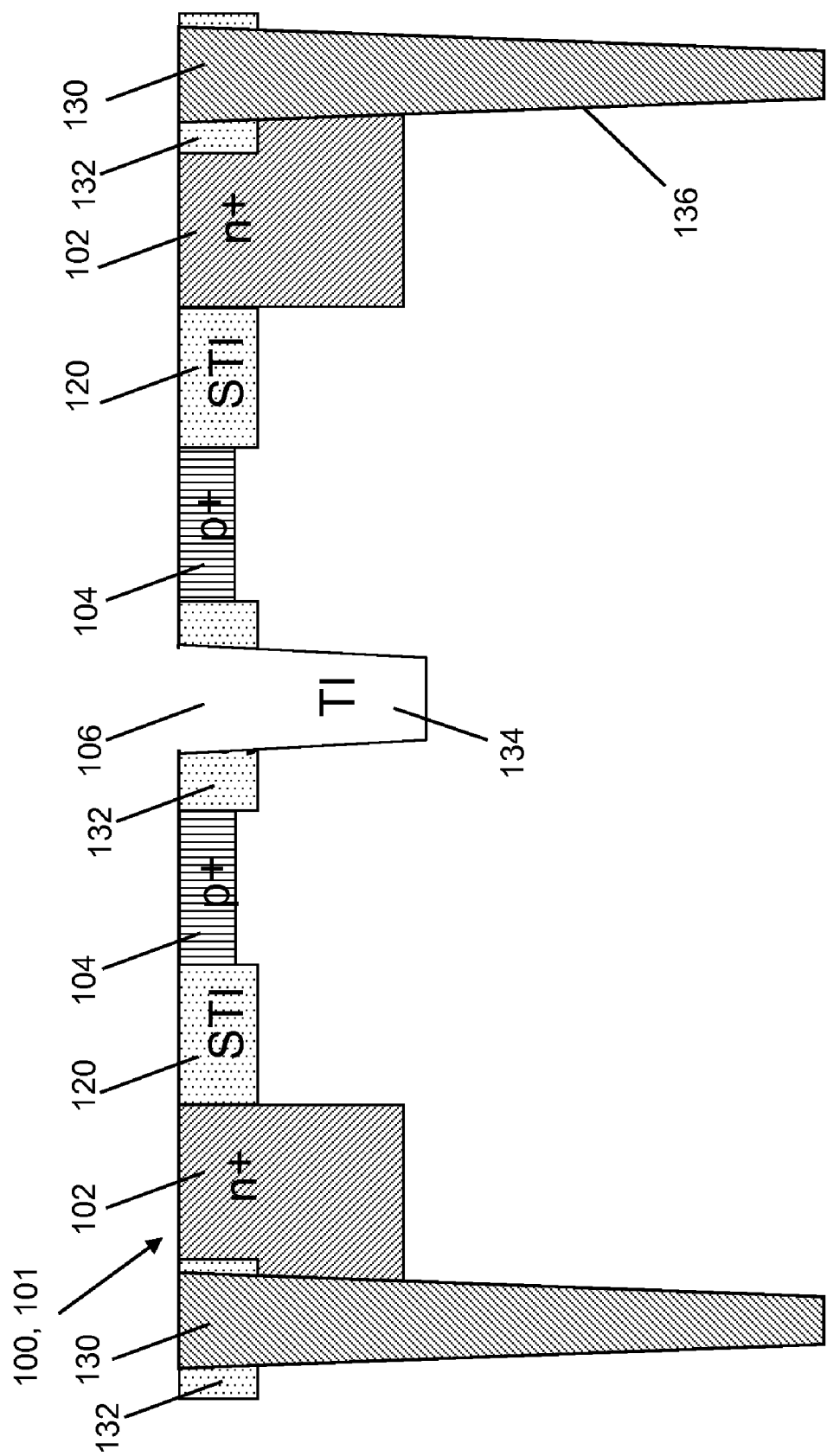
Figure 10:
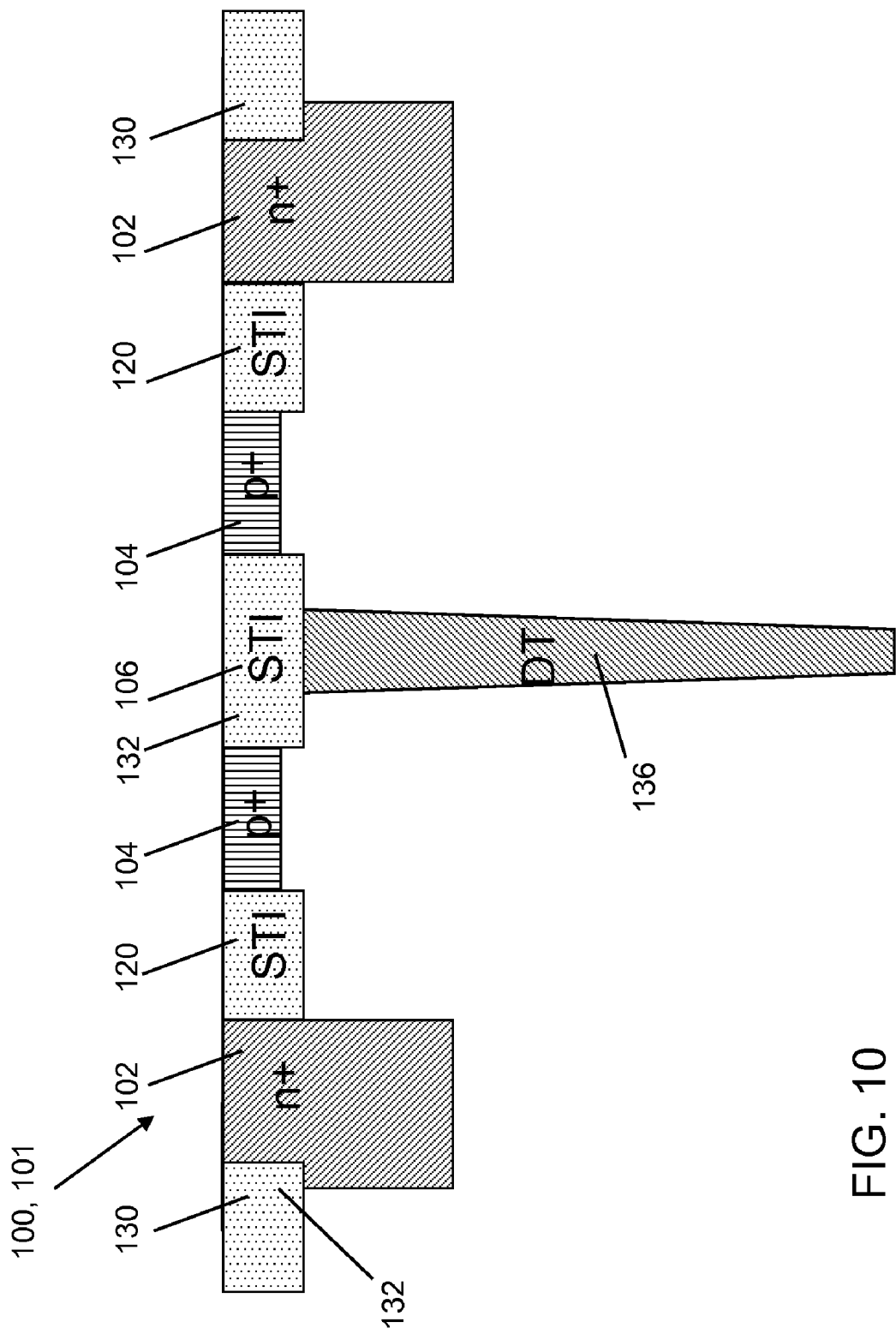
Figure 11:
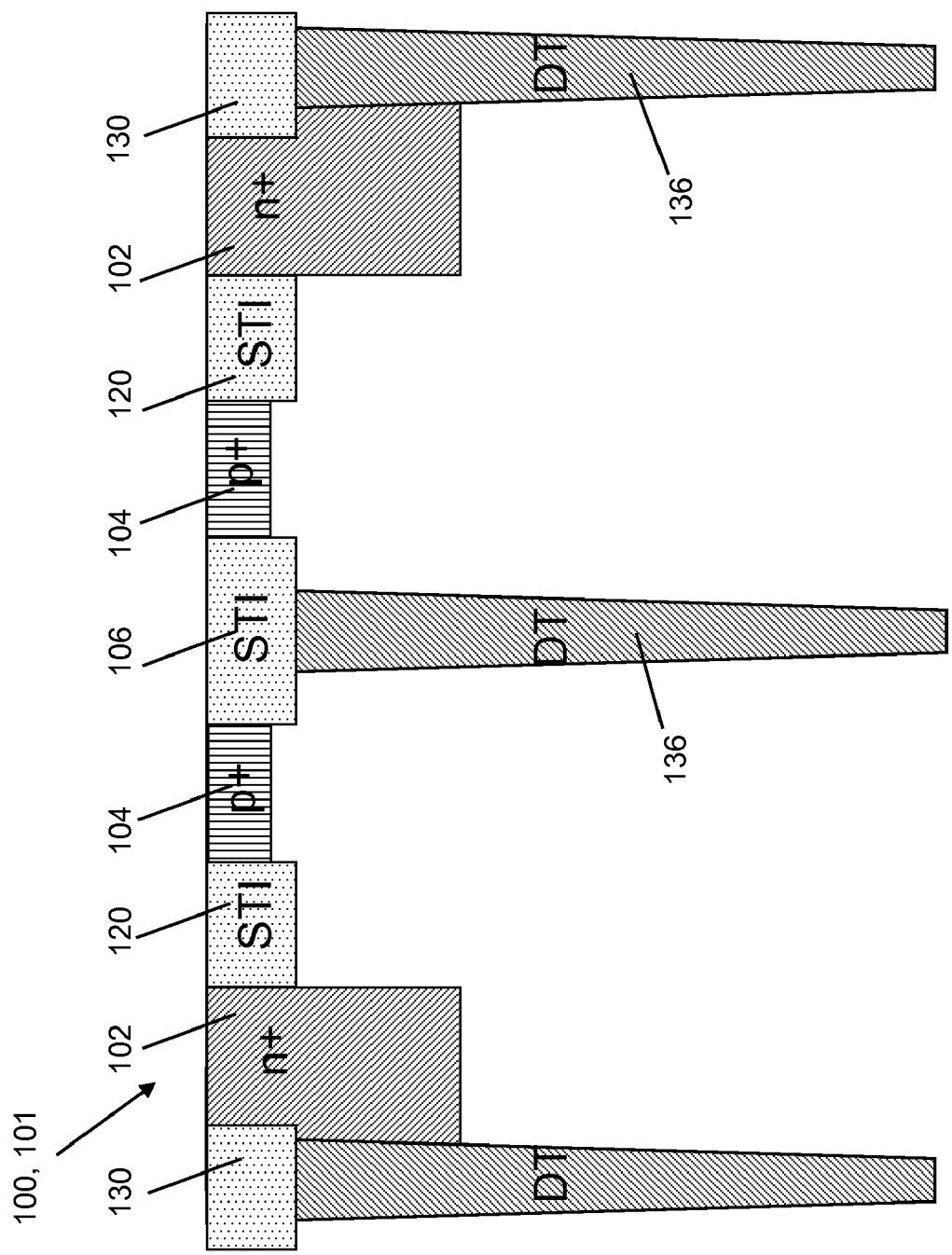

Turning to FIGS. 5-11, various embodiments of a lateral passive device 101 will now be described. FIG. 5 shows a lateral passive device 101 including annular insulator region 130 in the form of TI 134, and insulator region 106 in the form of STI 132. FIG. 6 shows a lateral passive device 101 including annular insulator region 130 in the form of DT 136, and insulator region 106 in the form of STI 132. FIG. 7 shows a lateral passive device 101 including insulator region 106 in the form of TI 134, and annular insulator region 130 in the form of STI 132. FIG. 8 shows a lateral passive device 101 including insulator region 106 and annular insulator region 130 in the form of TI 134. FIG. 9 shows a lateral passive device 101 including insulator region 106 in the form of TI 134, and annular insulator region 130 in the form of DT 136. FIG. 10 shows a lateral passive device 101 including insulator region 106 in the form of DT 136 through STI 132, and annular insulator region 130 in the form of STI 132. FIG. 11 shows a lateral passive device 101 including insulator region 106 in the form of DT 136, and annular insulator region 130 in the form of DT 136.

In one embodiment, a method is also provided, which includes providing a substrate, e.g., a silicon substrate 110; forming a first insulator region 106 in substrate 110; forming an annular electrode 104 surrounding first insulator region 106; and forming another annular electrode 102 surrounding first annular insulator region 120. The method may further include forming a first annular insulator region 120 surrounding annular electrode 104 (i.e., between annular electrode 104 and annular electrode 102), and/or forming a second annular insulator region 130 surrounding annular electrode 102. As described above, insulator region 106 and second annular insulator region 130 each may include one of: an STI 132, a TI 134 and a DT 136. The above-described embodiments may be formed using any now known or later developed fabrication methods. For example, patterning a photoresist and etching to form STI, TI or DT openings. Then, depositing an insulating material, e.g., silicon oxide ($SiO_2$), in the openings. Alternatively, certain insulator regions such as insulator region 120 can be formed by local oxidation of silicon (LOCOS). In one embodiment, isolation regions 106, 120, 130 may be formed, and then first and second annular electrodes 102, 104 may be formed by doping with the appropriate dopant, described above. The order of doping may vary. Further, the order of formation of the different structures may also vary.

Figure 12:
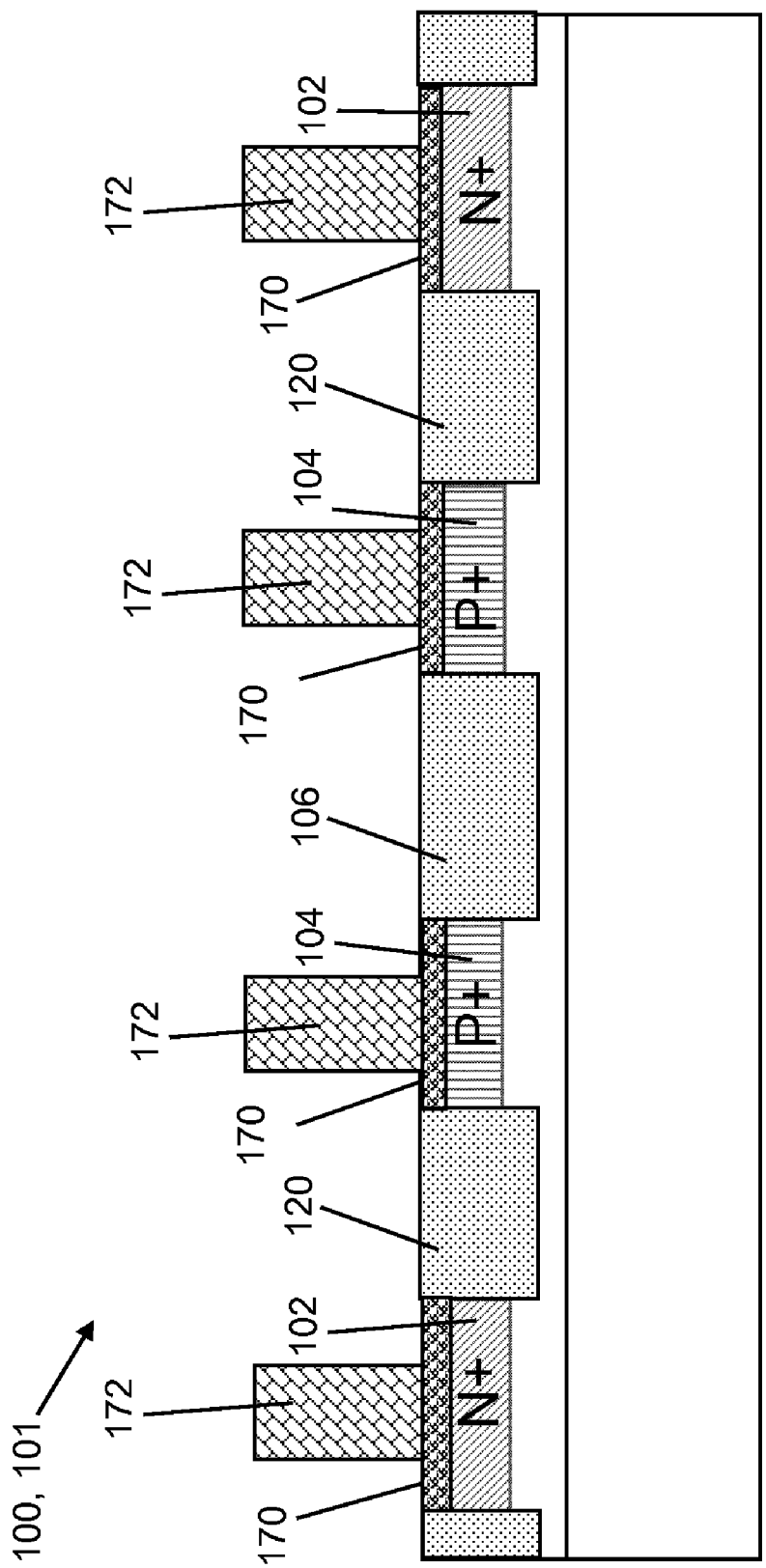
FIG. 12 shows an example embodiment including contacts according to the invention.

Subsequent processing may be conducted to form contacts to electrodes 102, 104. For example, FIG. 12 shows the FIG. 3 embodiment after subsequent processing including forming silicide 170 and ohmic contacts 172 to first and second annular electrodes 102, 104. As the knowledge of how this process is well known, it will not be described in detail here.

Figure 14:
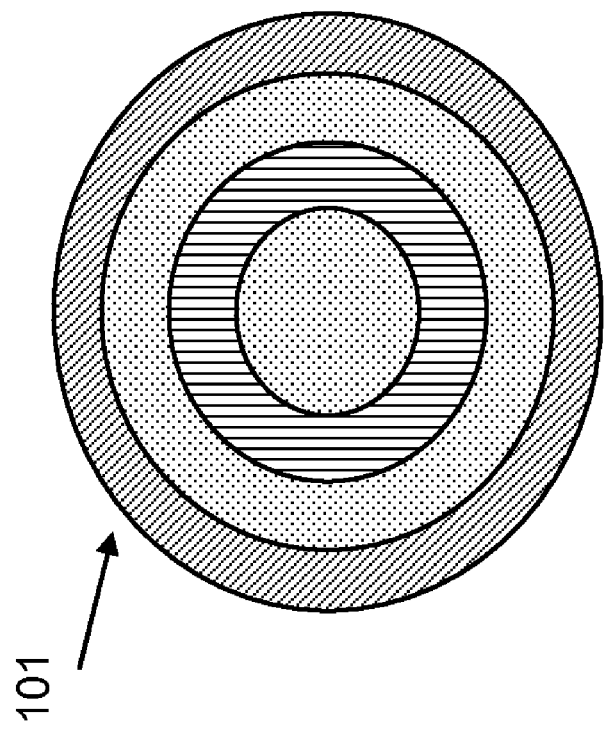
FIGS. 13-14 show alternative shapes for a lateral passive device according to various embodiments of the invention.
Figure 13:
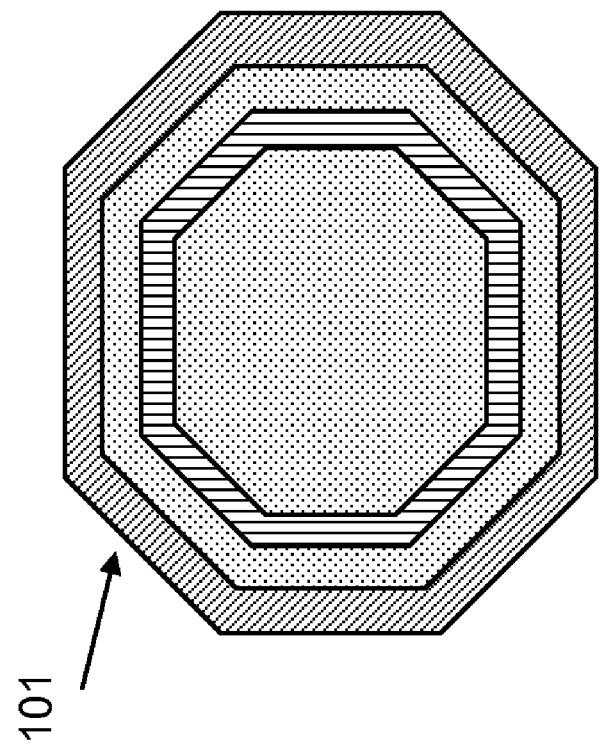

In the above-described embodiment, first and second electrodes 102, 104 are polygon, and more particular, substantially rectangular. FIGS. 13 and 14 show alternative shapes for lateral passive device 101 according to various embodiments of the invention. In FIG. 13, lateral passive device 101 is substantially octagonal, and in FIG. 14, lateral passive device 101 is substantially circular. Other shapes may also be possible and are considered within the scope of the invention. Each shape may be formed using any of the above-described methods.

Due to annular electrodes 102, 104 of lateral passive device 101, both the anode and cathode series resistance are optimized to the lowest values at a fixed device area. At the same time, the parasitic capacitance to a bottom plate (substrate 110) is greatly reduced. With lateral passive device 101, as described herein, it is expected the best quality factor can be yielded at a fixed device area. Another advantage for lateral passive device 101 is it has an additional freedom to increase size to achieve high radio frequency (RF) performance requirements without introducing any parasitic in the middle thereof because the middle is filled with insulating region 106.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a lateral passive device, comprising:
   providing a substrate;
   forming a first insulator region in the substrate, wherein the first insulator region includes a first deep trench isolation through a shallow trench isolation, wherein the first deep trench isolation through the shallow trench isolation is pillar-shaped and has a width that continuously tapers from one end below the shallow trench isolation to an end opposite therefrom, and wherein the pillar shape of the first deep trench isolation through the shallow trench isolation is substantially circular;

forming a first annular electrode surrounding the first insulator region;

forming a first annular insulator region surrounding the first annular electrode, wherein the first annular insulator region includes a shallow trench isolation;

forming a second annular electrode surrounding the first annular insulator region; and forming a second annular insulator region surrounding the second annular electrode, wherein the second annular insulator region includes a second deep trench isolation, wherein the second deep trench isolation of the second annular insulator region is discontinuous with the first deep trench isolation through the shallow trench isolation of the first insulator region, wherein the first annular electrode has a bottom surface that is higher than a bottom surface of the first insulator region, wherein the bottom surface of the first insulator region is higher than a bottom surface of the second annular electrode.

2. The method according to claim 1, wherein the first annular electrode is doped with a p+ dopant to form an anode in the lateral passive device, wherein the p+ dopant comprises one of boron (B), indium (In) or gallium (Ga).

3. The method according to claim 1, wherein the second annular electrode is doped with an n+ dopant to form a cathode in the lateral passive device, wherein the n+ dopant comprises one of phosphorous (P), arsenic (As) or antimony (Sb).

4. The method according to claim 1, wherein the lateral passive device is one of a lateral PN diode, a lateral PIN diode, a Schottky barrier diode or a varactor.

* * * * *